(12) United States Patent
Liu et al.

(10) Patent No.: US 12,550,295 B2
(45) Date of Patent: Feb. 10, 2026

(54) IMMERSION COOLING SYSTEM

(71) Applicant: Delta Electronics, Inc., Taoyuan (TW)

(72) Inventors: Hsuan-Ting Liu, Taoyuan (TW);
Yan-Hui Jian, Taoyuan (TW);
Chia-Hsing Chen, Taoyuan (TW);
Chen-Hsiu Lee, Taoyuan (TW);
Kuan-Lung Wu, Taoyuan (TW)

(73) Assignee: DELTA ELECTRONICS, INC.,
Taoyuan (TW)

( * ) Notice: Subject to any disclaimer, the term of this patent is extended or adjusted under 35 U.S.C. 154(b) by 204 days.

(21) Appl. No.: 18/511,507

(22) Filed: Nov. 16, 2023

(65) Prior Publication Data

US 2024/0251524 A1 Jul. 25, 2024

Related U.S. Application Data

(60) Provisional application No. 63/439,993, filed on Jan. 19, 2023.

(30) Foreign Application Priority Data

Jul. 20, 2023 (CN) .......................... 202310895805.6

(51) Int. Cl.
*H05K 7/20* (2006.01)

(52) U.S. Cl.
CPC ..... *H05K 7/20272* (2013.01); *H05K 7/20236* (2013.01); *H05K 7/20772* (2013.01)

(58) Field of Classification Search
CPC .......... H05K 7/20272; H05K 7/20236; H05K 7/20772; H05K 7/1492; H05K 7/20781; H05K 7/203; G06F 2200/201; G06F 1/20
See application file for complete search history.

(56) References Cited

U.S. PATENT DOCUMENTS

| 9,844,166 B2 | 12/2017 | Shelnutt et al. |
| 2022/0369504 A1 | 11/2022 | Clerc et al. |

(Continued)

FOREIGN PATENT DOCUMENTS

| CN | 104284536 A | 1/2015 |
| CN | 108882652 B | 7/2019 |

(Continued)

OTHER PUBLICATIONS

Taiwanese Office Action and Search Report corresponding to TW application No. 112127055 dated Apr. 1, 2024; pp. 1-3.

(Continued)

*Primary Examiner* — Stephen S Sul
(74) *Attorney, Agent, or Firm* — MUNCY, GEISSLER, OLDS & LOWE, P.C.

(57) ABSTRACT

An immersion cooling system is provided and includes a storage tank, an adapter frame, and an electronic device. The storage tank includes an accommodating tank and a sealing cover for sealing the opening of the accommodating tank. The adapter frame includes a first wire channel attached to the side of the adapter frame, and is disposed in the accommodating tank in a vertical direction. The electronic device includes at least one power wire, and is inserted into the adapter frame along the above direction. The side of the electronic device is attached to the side of the first wire channel. A second wire channel is formed between the bottoms of the electronic device and the adapter frame, and the first and second wire channels communicate with each other. The power wire is connected to the circuit of the external power apparatus along the first and second wire channels.

19 Claims, 6 Drawing Sheets

(56) References Cited

U.S. PATENT DOCUMENTS

| | | | |
|---|---|---|---|
| 2023/0042343 A1* | 2/2023 | Hashimoto | H05K 7/20272 |
| 2024/0015930 A1* | 1/2024 | Tu | H05K 7/20318 |
| 2024/0090156 A1* | 3/2024 | Dittus | H05K 7/20781 |
| 2025/0081383 A1* | 3/2025 | Lau | H05K 7/1491 |

FOREIGN PATENT DOCUMENTS

| | | |
|---|---|---|
| CN | 112135470 A | 12/2020 |
| CN | 214545184 U | 10/2021 |
| CN | 113923923 A | 1/2022 |
| CN | 114449826 A | 5/2022 |
| CN | 115016611 A | 9/2022 |
| CN | 115209685 A | 10/2022 |
| WO | WO2016036316 A1 | 3/2016 |
| WO | WO2019061722 A1 | 4/2019 |

OTHER PUBLICATIONS

Extended Search Report of its corresponding EP application No. 23211102.1 issued on May 22, 2024; pp. 1-6.

* cited by examiner

IMMERSION COOLING SYSTEM

CROSS REFERENCE TO RELATED APPLICATIONS

This Application claims the benefit of U.S. Provisional Application No. 63/439,993, filed Jan. 19, 2023, and claims priority of China Patent Application No. 202310895805.6, filed on Jul. 20, 2023, the entirety of which are incorporated by reference herein.

BACKGROUND OF THE INVENTION

Field of the Invention

The present invention relates to an immersion cooling system, and, in particular, to an immersion cooling system having a pressure balance pipe.

Description of the Related Art

With the advance of technology, the application of electronic apparatuses has become more and more common. In particular, various communication apparatuses such as server apparatuses have gradually become an indispensable part of daily life. These electronic devices generate a large amount of heat during operation, and therefore require immersion cooling systems.

Traditional server apparatuses are mostly arranged horizontally, however. This configuration is not conducive to placing the electronic devices in an immersion cooling system. Therefore, the electronic devices need to be installed in the immersion cooling system vertically, which is a laborious process for users and increases the difficulty of installation. As set forth above, how to effectively balance the convenience of use and the heat dissipation performance of the immersion cooling system will become an urgent issue. In addition, if the convenience of installing and removing the electronic devices can be improved, the loss of coolant can also be reduced, thereby reducing the cost of use.

BRIEF SUMMARY OF THE INVENTION

An embodiment of the present invention provides an immersion cooling system. The immersion cooling system includes a storage tank, an adapter frame and an electronic device. The storage tank includes a sealing cover and an accommodating tank, and the sealing cover is configured to seal an opening of the accommodating tank. The adapter frame includes a first wire channel. The first wire channel is attached to one side of the adapter frame, and the adapter frame is disposed in the accommodating tank in a direction that is perpendicular to the bottom of the accommodating tank. The electronic device includes at least one power wire. The electronic device is inserted into the adapter frame along said direction, and one side of the electronic device is attached to one side of the first wire channel. There is a distance between the bottom of the electronic device and the bottom of the adapter frame, forming a second wire channel. The first wire channel and the second wire channel communicate with each other. The at least one power wire is electrically connected to an external electric apparatus from the bottom of the electronic device along the first wire channel and the second wire channel.

An embodiment of the present invention provides an immersion cooling system. The immersion cooling system includes a storage tank, an adapter frame and an electronic device. The storage tank includes a sealing cover and an accommodating tank, and the sealing cover is configured to seal the opening of the accommodating tank. The adapter frame includes a first wire channel. The first wire channel is attached to one side of the adapter frame, and the adapter frame is disposed in the accommodating tank in a direction perpendicular to the bottom of the accommodating tank. The electronic device is inserted into the adapter frame in the direction. The adapter frame includes a positioning portion adjacent to the first wire channel and matched with a bracket of the accommodating groove, the positioning portion has a plurality of openings configured for a hanging apparatus connected to the adapter frame.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The immersion cooling systems of some embodiments of the present disclosure are described in the following description. However, it should be appreciated that the following detailed description of some embodiments of the disclosure provides various concepts of the present disclosure which may be performed in specific backgrounds that can vary widely. The specific embodiments disclosed are provided merely to clearly describe the usage of the present disclosure by some specific methods without limiting the scope of the present disclosure.

In addition, spatially relative terms, such as "lower," or "bottom," and "upper," or "top," may be used herein to describe one element or feature's relationship to another element or feature as illustrated in the figures. It should be understood that if the figures are turned upside-down, the element located on the "lower" side may become the element located on the "upper" side.

It should be appreciated that although the terms "first" and "second" may be used herein to describe various elements, materials and/or portions, these elements, materials and/or portions should not be limited by these terms. These terms are merely intended to distinguish different elements, materials and/or portions. Accordingly, a first element, material and/or portion discussed as follows may be referred to as a second element, material and/or portion without departing from the teaching of some embodiments in the present disclosure.

Unless defined otherwise, all terms (including technical and scientific terms) used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined in the present disclosure. In addition, the terms "substantially," "about" or "approximately" may be recited herein, and are intended to encompass the circumstances or ranges that are substantially the same and exactly the same. It should be noted that unless specially defined, even if the above terms are not recited in the description, it should be interpreted as the same meaning as the above approximate terms that are recited.

Figure 1:
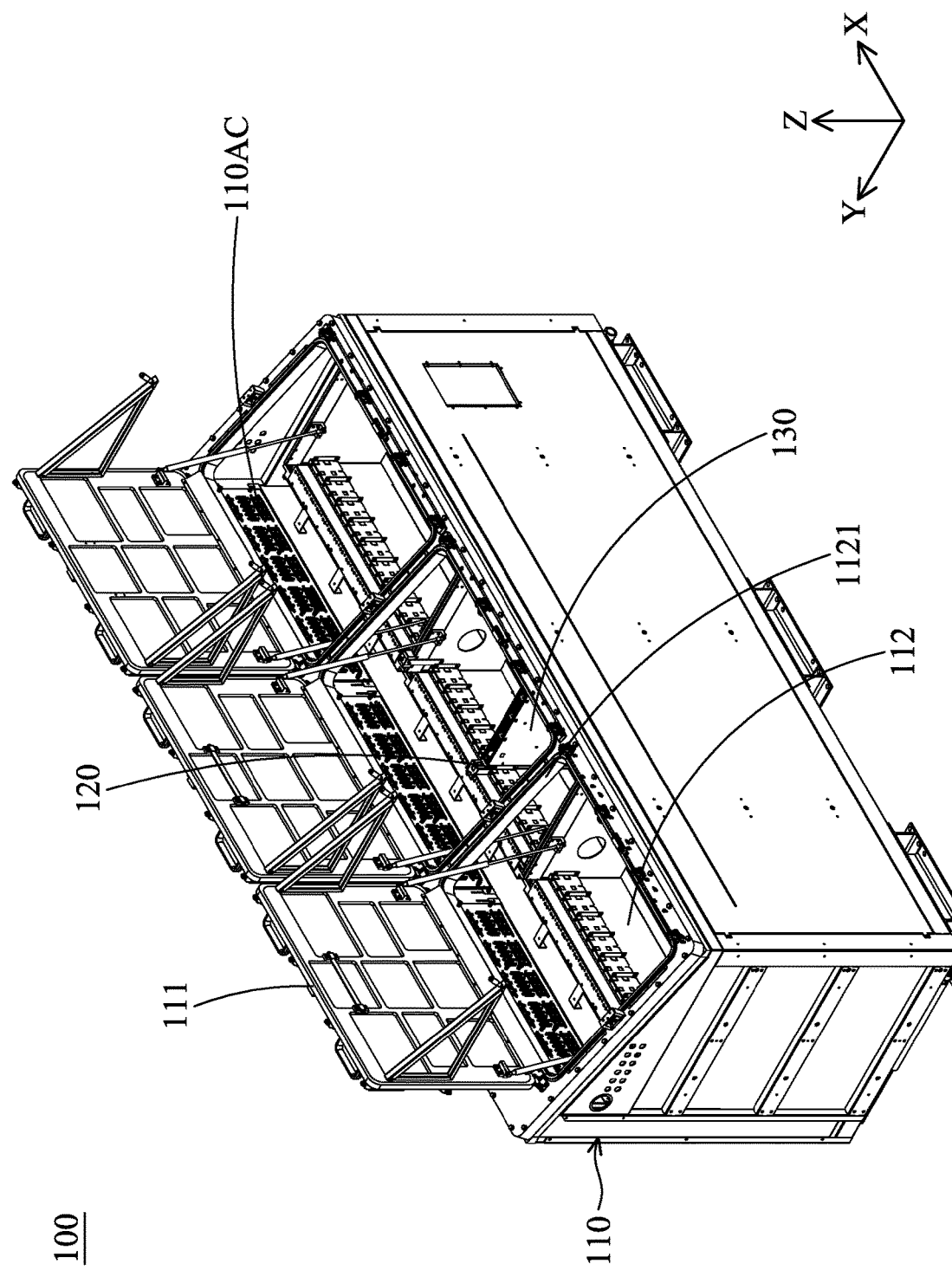
FIG. 1 illustrates a perspective view of an immersion cooling system in accordance with some embodiments of the present disclosure.

Please referring to FIG. 1, FIG. 1 illustrates a perspective view of an immersion cooling system 100 in accordance with some embodiments of the present disclosure. In some embodiments, the immersion cooling system 100 may be used, for example, in a server system, but the present disclosure is not limited thereto. As shown in FIG. 1, the immersion cooling system 100 may include a storage tank 110, an adapter frame 120 and an electronic device 130. In some embodiments, the storage tank 110 includes a sealing cover 111 and an accommodating tank 112, and the sealing cover 111 can be configured to seal the opening 1121 of the accommodating tank 112. For example, the accommodating tank 112 may have a plurality of openings 1121, and the storage tank 110 may include a plurality of sealing covers 111, and these sealing covers 111 respectively seal each of the openings 1121 of the accommodating tank 112. In some embodiments, the accommodating tank 112 can be used to accommodate a coolant (not shown), and the electronic device 130 can be immersed into the coolant in the accommodating tank 112. As a result, the heat energy generated during the operation of the electronic device 130 can be taken away by the flow of the coolant, maintaining the electronic device 130 at an appropriate operating temperature and reducing the risk of failure of the electronic device 130 due to overheating. For example, the coolant may include fluorine-containing compounds or other suitable polymer compounds, but the present disclosure is not limited thereto.

In addition, the adapter frame 120 is disposed in the accommodating tank 112 in a direction (for example, the Z direction) that is perpendicular to the bottom of the accommodating tank 112. The electronic device 130 is inserted into the adapter frame 120 along the aforementioned direction (for example, the Z direction). In this way, the electronic device 130 can be vertically disposed in the accommodating tank 112. In some embodiments, a hanging apparatus (not shown), such as a crane, may be used to pick up and place the adapter frame 120, so that the users can arrange the electronic device 130 with relatively less effort.

Figure 2:
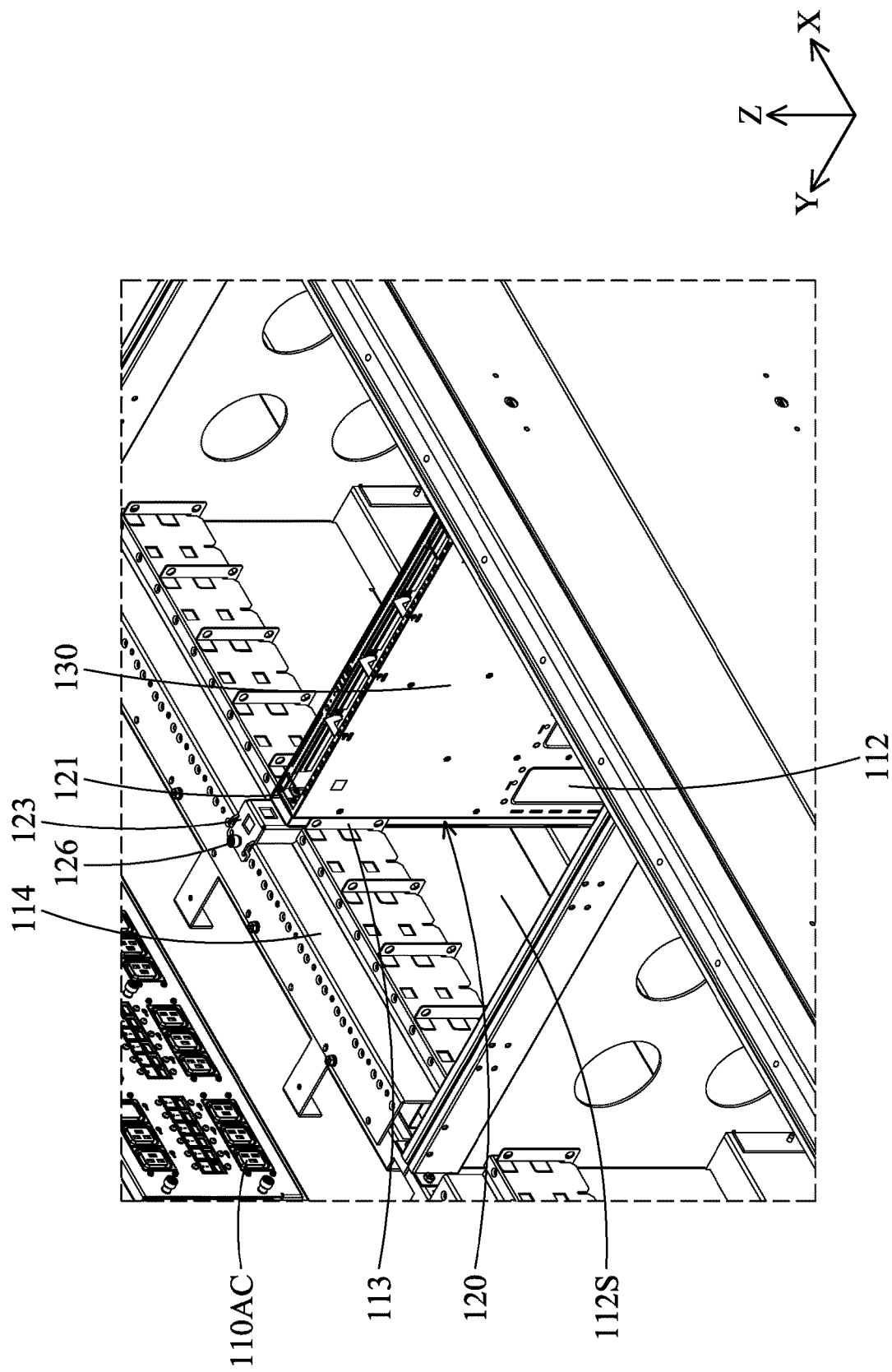
FIG. 2 illustrates a partially enlarged view of the immersion cooling system in accordance with some embodiments of the present disclosure.

FIG. 2 illustrates a partially enlarged view of the immersion cooling system 100 in accordance with some embodiments of the present disclosure. As shown in FIG. 2, a plurality of positioning members 113 are disposed on the sidewall 112S of the accommodating tank 112 and are suitable for abutting against the adapter frame 120. The arrangement of the positioning member 113 may facilitate setting the adapter frame 120 to a predetermined position. In some embodiments, the adapter frame 120 includes a first wire channel 121 and a positioning portion 123, wherein the first wire channel 121 is attached to the side of the adapter frame 121, and the positioning portion 123 is adjacent to the first wire channel 123 and is matched with the bracket 114 of the accommodating tank 112. For example, the positioning portion 123 may abut against the bracket 114 of the accommodating tank 112, and the shape of the positioning portion 123 may correspond to the outline of the bracket 114. As a result, the adapter frame 120 can be stably disposed in the accommodating tank 112. In addition, in some embodiments, a fixing member 126 may be disposed to penetrate through the adapter frame 120 and the bracket 114 of the accommodating tank 112 to strengthen the connection between the adapter frame 120 and the accommodating tank 112.

Figure 3A:
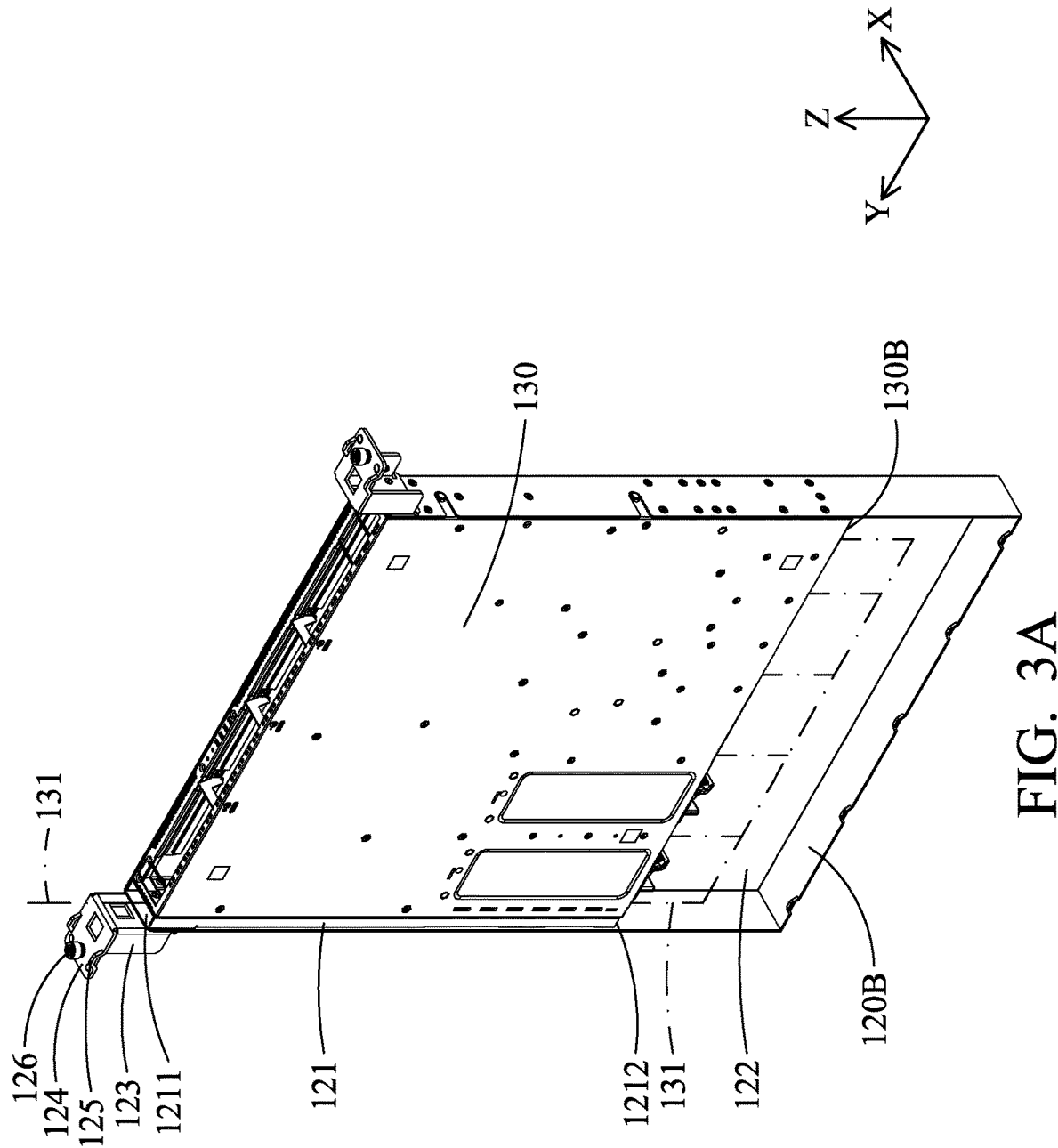
FIG. 3A illustrates a perspective view of an adapter frame and an electronic device in accordance with some embodiments of the present disclosure.
Figure 4:
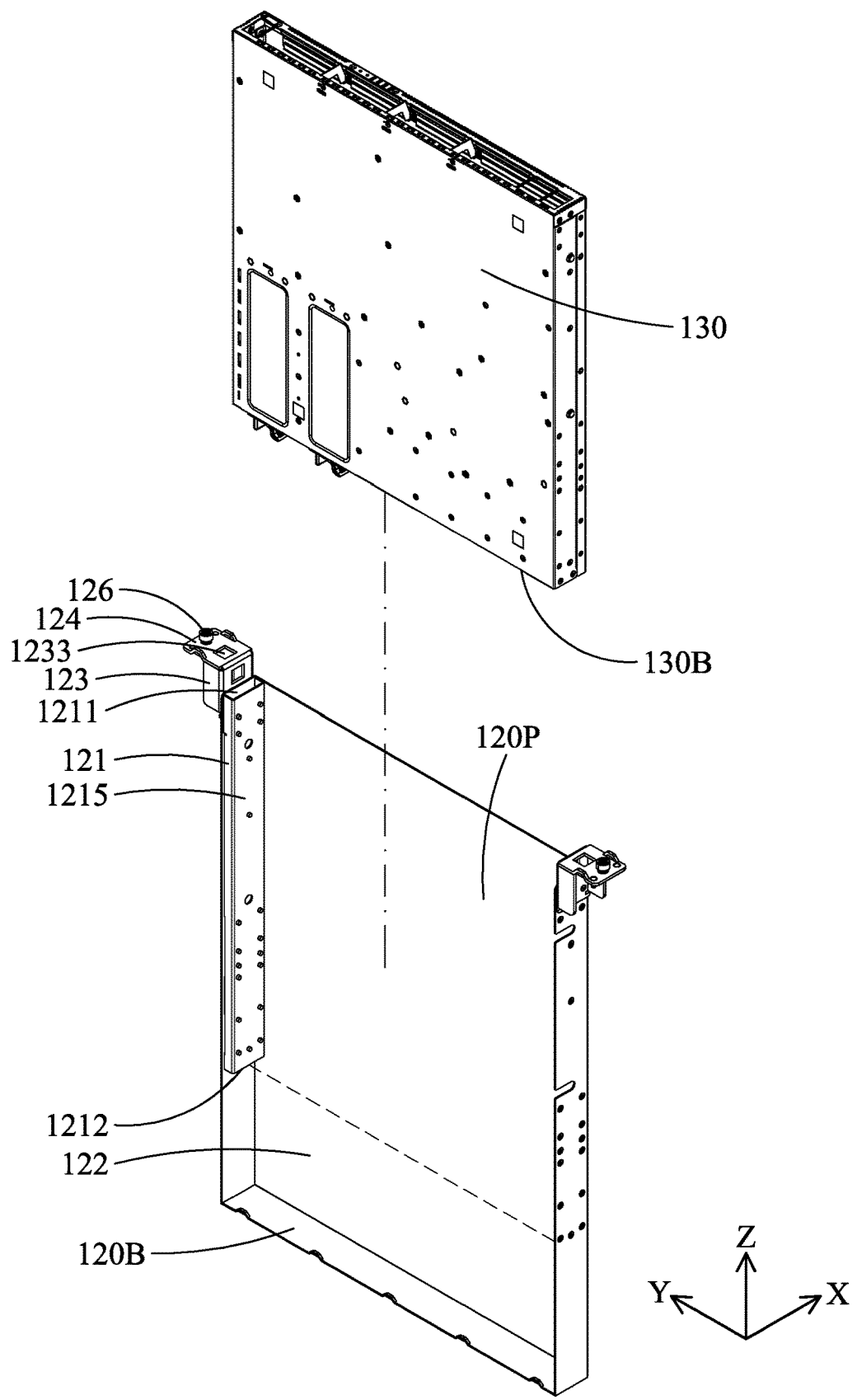
FIG. 4 illustrates an exploded view of the adapter frame and the electronic device in accordance with some embodiments of the present disclosure.

FIG. 3A illustrates a perspective view of the adapter frame 120 and the electronic device 130 in accordance with some embodiments of the present disclosure. FIG. 4 illustrates an exploded view of the adapter frame 120 and the electronic device 130 in accordance with some embodiments of the present disclosure. As shown in FIG. 3A, the electronic device 130 includes at least one power wire 131 (shown in dotted lines), and the side of the electronic device 130 is attached to the side of the first wire channel 121. In addition, a non-zero distance is formed between the bottom 130B of the electronic device 130 and the bottom 120B of the adapter frame 120 to form the second wire channel 122, and the first wire channel 121 and the second wire channel 122 communicate with each other. As a result, the power wire 131 can be connected to the circuit of an external power apparatus (not shown) via the connection socket 110AC from the bottom 130B of the electronic device 130 along the first wire channel 121 and the second wire channel 122.

In some embodiments, the power wire 131 may extend downward from the bottom 130B of the electronic device 130 to the second wire channel 122, enter the first wire channel 121 via the hub end 1212 of the first wire channel 121, and leave the first wire channel 121 in the direction that is perpendicular to the bottom 120B of the adapter frame 120 (for example, the Z direction), so as to be connected to the circuit of the external electric apparatus. In some embodiments, the positioning portion 123 protrudes from the outlet end 1211 of the first wire channel 121, but the present disclosure is not limited thereto.

In some embodiments, the adapter frame 120 further includes an extension portion 124 that is connected to the top surface 123T of the positioning portion 123 (for example, referring to FIG. 5) and extend in a direction (for example, the Y direction) that is parallel to the top surface 123T. In addition, at least one protruding portion 125 is disposed on the extension portion 124 and protrudes toward a direction (for example, the Z direction) that is away from the electronic device 130, but the present disclosure is not limited thereto. In other embodiments, the protruding portion 125 may be omitted or formed to protrude in other directions, and these configurations are all included within the scope of the present disclosure.

Figure 3B:
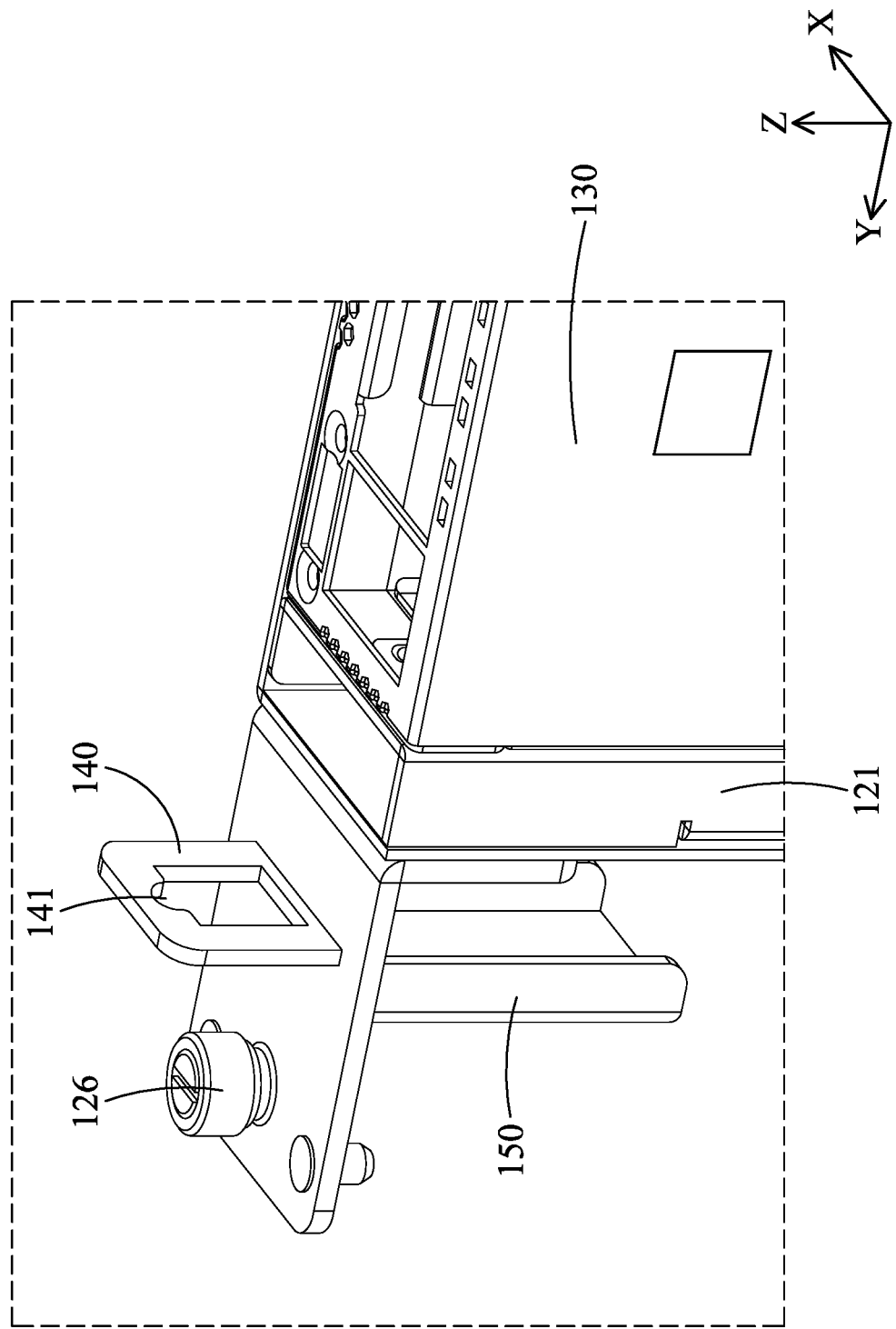
FIG. 3B illustrates a partially enlarged view of the adapter frame and the electronic device in accordance with other embodiments of the present disclosure.

FIG. 3B illustrates a partially enlarged view of the adapter frame 120 and the electronic device 130 in accordance with other embodiments of the present disclosure. As shown in FIG. 3B, a hanging ear 140 is disposed beside the first wire channel 121, and the corresponding positioning portion 150 is disposed below the hanging ear 140. In some embodiments, the hanging ear 140 is suitable for a hanging apparatus (not shown) connected to the adapter frame 120 to pick up or place the adapter frame 120 (and the electronic device 130 mounted on the adapter frame 120). In some embodiments, the positioning portion 150 is configured to be positioned on the bracket 114, so that the adapter frame 120 can be disposed in the accommodating tank 112 in the direction (for example, the Z direction) that is perpendicular to the bottom of the accommodating tank 112 (for example, referring to FIG. 1). In some embodiments, the hanging ear 140 may have a recess 141 that is configured to correspond to the hook-shaped structure of the hanging apparatus. As a result, it is beneficial to pick up or place the adapter frame 120 more stably.

As shown in FIG. 4, the adapter frame 120 further includes a back plate 120P, which is connected to the bottom 120B of the adapter frame 120 and the side 1215 of the first wire channel 121 (i.e., the side facing the electronic device 130). The back plate 120P can protect the electronic device 130 and reduce the risk of damage to the backside of the electronic device 130 due to external force. In addition, the back plate 120P is also beneficial to accommodate the power wires 131 (for example, referring to FIG. 3) in the adapter frame 120, reducing the risk of interference among the power wires 131 in different adapter frames 120. Furthermore, the back plate 120P may be connected to opposite sides of the adapter frame 120 to increase the structural strength of the adapter frame 120. In an exemplary embodiment, a single back plate 120P is formed, so that the users may adjust the configuration of the electronic device 130 (for example, adjust the configuration of the power wires 131) on the side opposite the back plate 120P. However, the present disclosure is not limited thereto. In other embodiments, the back plates 120P may be disposed on opposite sides of the adapter frame 120 to enhance the protection of the electronic device 130.

In some embodiments, the length of the side of the electronic device 130 is approximately equal to the length of the side 1215 of the first wire channel 121, wherein the above-mentioned lengths may be, for example, measured in the Z direction (or the direction which is perpendicular to the bottom 120B of the adapter frame 120). In other words, the bottom 130B of the electronic device 130 is level with the hub end 1212 of the first wire channel 121 in the direction (such as the X-Y plane) which is parallel to the bottom of the accommodating tank 112 (and/or the bottom 120B of the adapter frame 120). However, the present disclosure is not limited thereto. In other embodiments, the length of the side of the electronic device 130 may be set to be greater than or smaller than the length of the side 1215 of the first wire channel 121. As long as a non-zero distance is formed between the bottom 130B of the electronic device 130 and the bottom 120B of the adapter frame 120, these configurations are all included within the scope of the present disclosure.

In some embodiments, a plurality of openings 1233 are formed on the positioning portion 123, and are configured for hanging apparatus (not shown) connected to the adapter frame 120 to pick up or place the adapter frame 120 (and the electronic device 130 installed on the adapter frame 120). Specifically, the openings 1233 of the positioning portion 123 communicate with each other to form a space in the positioning portion 123, and the hanging apparatus can extend into the above-mentioned space to pick up or place the adapter frame 120. For example, the openings 1233 of the positioning portion 123 each have a rectangular outline, but the present disclosure is not limited thereto. In some embodiments, the openings 1233 may be circular, or they may have another regular or irregular outline. These configurations are also included within the scope of the present disclosure.

Figure 5:
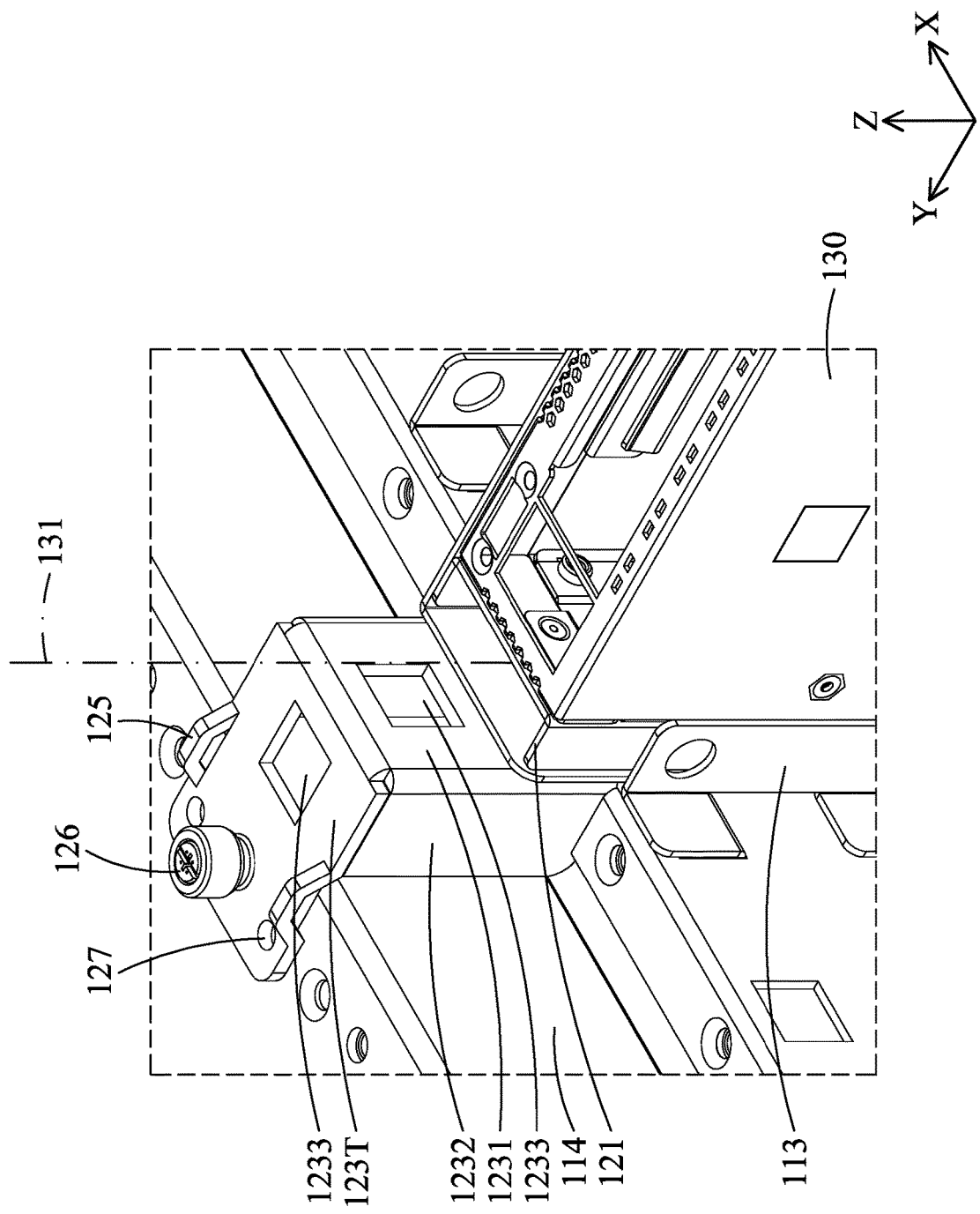
FIG. 5 illustrates a partially enlarged view of the immersion cooling system in accordance with some embodiments of the present disclosure.

FIG. 5 illustrates a partially enlarged view of the immersion cooling system 100 in accordance with some embodiments of the present disclosure. As shown in FIG. 5, the openings 1233 of the positioning portion 123 may be located on the top surface 123T of the positioning portion 123 and the first sidewall 1231 connected to the top surface 123T. No opening 1233 is formed on the second sidewall 1232 which is connected to the top surface 123T and the first sidewall 1231. However, the above-mentioned configuration is just an example and not intended to limit the scope of the present disclosure. For example, the openings 1233 may be formed on the top surface 123T, the first sidewall 1231 and the second sidewall 1232, respectively. All possible configurations will not be listed one-by-one as follows. In addition, at least one hole 127 is formed on the extension portion 124 and configured to be aligned with at least one hole (not shown) on the bracket 114. As a result, an additional fixing member (not shown) may be disposed through the holes (i.e., through the adapter frame 120 and the bracket 114) to further strengthen the connection between the adapter frame 120 and the accommodating tank 112. To be more specific, the additional fixing member can be beneficial to locate the combined adapter frame 120 and electronic device 130 at a predetermined position, so that the fixing member 126 may be locked into the corresponding hole on the bracket 114, thereby reducing the risk of displacement between the adapter frame 120 and the electronic device 130 in the vertical direction (which is, for example, parallel to the Z-axis).

As set forth above, the present disclosure provides an immersion cooling system that includes an adapter frame for accommodating electronic devices. To be more specific, with the arrangement of the adapter frame, the electronic device can be disposed vertically in the accommodating tank which contains the coolant, so that the users can install the electronic device with relatively less effort. In addition, the adapter frame also includes a first wire channel and a second wire channel that communicate with each other, so that the power wire may be connected to the circuit of the external electric apparatus from the bottom of the electronic device along the first wire channel and the second wire channel, realizing the electrical connection of electronic devices in the vertical direction.

While the embodiments and the advantages of the present disclosure have been described above, it should be understood that those skilled in the art may make various changes, substitutions, and alterations to the present disclosure without departing from the spirit and scope of the present disclosure. In addition, the scope of the present disclosure is not limited to the processes, machines, manufacture, composition, devices, methods and steps in the specific embodiments described in the specification. Those skilled in the art may understand existing or developing processes, machines, manufacture, compositions, devices, methods and steps from some embodiments of the present disclosure. As long as those may perform substantially the same function in the aforementioned embodiments and obtain substantially the same result, they may be used in accordance with some embodiments of the present disclosure. Therefore, the scope of the present disclosure includes the aforementioned processes, machines, manufacture, composition, devices, methods, and steps. Furthermore, each of the appended claims constructs an individual embodiment, and the scope of the present disclosure also includes every combination of the appended claims and embodiments.

What is claimed is:

1. An immersion cooling system, comprising:
   a storage tank comprising a sealing cover and an accommodating tank, and the sealing cover is configured to seal an opening of the accommodating tank;
   an adapter frame comprising a first wire channel, wherein the first wire channel is attached to one side of the adapter frame, and the adapter frame is disposed in the accommodating tank in a direction perpendicular to a bottom of the accommodating tank; and
   an electronic device comprising at least one power wire, wherein the electronic device is inserted into the adapter frame along the direction, and one side of the electronic device is attached to one side of the first wire channel,
   wherein a distance is formed between a bottom of the electronic device and a bottom of the adapter frame to form a second wire channel, and the first wire channel and the second wire channel communicate with each other,
   wherein the at least one power wire is electrically connected to an external electric apparatus from the bottom of the electronic device along the first wire channel and the second wire channel.

2. The immersion cooling system as claimed in claim 1, wherein the adapter frame further comprises a positioning portion adjacent to the first wire channel, and the positioning portion is matched with a bracket of the accommodating tank.

3. The immersion cooling system as claimed in claim 2, wherein the adapter frame further comprises an extension portion connected to a top surface of the positioning portion and extending in a direction parallel to the top surface.

4. The immersion cooling system as claimed in claim 3, wherein the adapter frame further comprises a fixing member suitable for penetrating through the extension portion and the bracket of the accommodating tank, so that the adapter frame is affixed to the accommodating tank.

5. The immersion cooling system as claimed in claim 3, wherein the extension portion has at least one hole configured to be aligned with one hole on the bracket.

6. The immersion cooling system as claimed in claim 2, wherein the positioning portion protrudes from an outlet end of the first wire channel.

7. The immersion cooling system as claimed in claim 2, wherein the positioning portion has a plurality of openings, and the plurality of openings of the positioning portion communicate with each other.

8. The immersion cooling system as claimed in claim 1, wherein a length of the one side of the electronic device is equal to a length of the one side of the first wire channel.

9. The immersion cooling system as claimed in claim 1, wherein the adapter frame further comprises a back plate connected to the bottom of the adapter frame and the one side of the first wire channel.

10. The immersion cooling system as claimed in claim 1, wherein the accommodating tank further comprises a positioning member disposed on a sidewall of the accommodating tank and configured to abut against the adapter frame.

11. The immersion cooling system as claimed in claim 1, further comprising a hanging ear disposed beside the first wire channel, and a positioning portion of the adapter frame is disposed below the hanging ear.

12. The immersion cooling system as claimed in claim 11, wherein the hanging ear has a recess configured to correspond to a hook-shaped structure of a hanging apparatus.

13. An immersion cooling system, comprising:
    a storage tank comprising a sealing cover and an accommodating tank, and the sealing cover is configured to seal an opening of the accommodating tank;
    an adapter frame comprising a first wire channel, wherein the first wire channel is attached to one side of the adapter frame, and the adapter frame is disposed in the accommodating tank in a direction perpendicular to a bottom of the accommodating tank; and
    an electronic device inserted into the adapter frame in the direction,
    wherein the adapter frame comprises a positioning portion adjacent to the first wire channel, the positioning portion is matched with a bracket of the accommodating tank, and the positioning portion has a plurality of openings configured for a hanging apparatus connected to the adapter frame, the adapter frame further comprises:
    an extension portion connected to a top surface of the positioning portion and extending in a direction that is parallel to the top surface; and
    a plurality of protruding portions disposed on the extension portion and protruding toward a direction that is away from the electronic device.

14. The immersion cooling system as claimed in claim 13, wherein the plurality of openings of the positioning portion each have a rectangular outline.

15. The immersion cooling system as claimed in claim 13, wherein the plurality of openings of the positioning portion are located on a top surface of the positioning portion and a sidewall connected to the top surface.

16. The immersion cooling system as claimed in claim 13, wherein a bottom of the electronic device is level with a hub end of the first wire channel in a direction parallel to the bottom of the accommodating tank.

17. The immersion cooling system as claimed in claim 13, wherein the plurality of openings of the positioning portion communicate with each other.

18. The immersion cooling system as claimed in claim 13, wherein the plurality of protruding portions are located on opposite sides of the extension portion.

19. The immersion cooling system as claimed in claim 13, wherein the plurality of openings of the positioning portion are located over the first wire channel.

* * * * *